United States Patent [19]
Komoto et al.

[11] Patent Number: 5,324,962
[45] Date of Patent: Jun. 28, 1994

[54] MULTI-COLOR SEMICONDUCTOR LIGHT EMITTING DEVICE

[75] Inventors: Satoshi Komoto, Tokyo; Hiroshi Nagasawa, Yokohama; Hitoshi Kawasaki, Kawasaki, all of Japan

[73] Assignee: Kabushiki Kaisha Toshiba, Kawagawa, Japan

[21] Appl. No.: 897,742

[22] Filed: Jun. 12, 1992

[30] Foreign Application Priority Data

Jun. 13, 1991 [JP] Japan ................................ 3-141799

[51] Int. Cl.$^5$ ............................................. H01L 33/00
[52] U.S. Cl. ........................................ 257/89; 257/88; 257/99
[58] Field of Search ............... 257/88, 89, 99, 100, 257/918, 921; 313/500, 512; 362/800

[56] References Cited

U.S. PATENT DOCUMENTS 4,630,183  12/1986  Fujita ................................ 362/800
5,008,788   4/1991  Palinkas ........................... 362/800

FOREIGN PATENT DOCUMENTS 55-55586   4/1980  Japan ................................. 257/99
61-89683   5/1986  Japan ................................. 257/99
1-31473    2/1989  Japan ................................. 257/89
2-238679   9/1990  Japan ................................. 257/89
2-238680   9/1990  Japan ................................ 257/100

Primary Examiner—Rolf Hille
Assistant Examiner—Minhloan Tran
Attorney, Agent, or Firm—Finnegan, Henderson, Farabow, Garrett & Dunner

[57] ABSTRACT

A semiconductor light emitting device of this invention has more than three light emitting diodes which includes a pair of diodes connected parallel in the reverse direction for each other. A common terminal connecting each one of the electrodes of said all diodes, the first terminal in which the other electrodes of said diode pair is connected, and the second terminal in which the other electrode of the rest diode is connected, are provide in order to drive said diodes separately.

3 Claims, 5 Drawing Sheets

MULTI-COLOR SEMICONDUCTOR LIGHT EMITTING DEVICE

BACKGROUND OF THE INVENTION

1. Field of the Invention

This invention relates to a semiconductor light emitting device in which more than three light emitting diodes are equipped to emit various colors of light.

2. Description of the Prior Arts

A prior art multi-color light emitting device is shown in FIG. 5. This device is comprised of a plurality of light emitting diodes (LEDs), each of which emits light having a different wave length.

As shown in FIG. 5a, a multi-color LED lamp includes three light emitting diodes 1a, 1b, and 1c, each of which emits light having a different wave length. These diodes are placed on a lead 2, and molded by plastics 5. Actually, the cathode sides (N sides) of these diodes are electrically connected with the top surface of lead 2. On the other hand, each anode side (P side) of diodes 1a, 1b, or 1c is connected with a respective bonding lead 4a, 4b, or 4c through a corresponding bonding wire 3a, 3b, or 3c.

As shown in FIG. 5b, those light emitting diodes 1a, 1b, and 1c are parallel-connected with each other in the forward direction so as to connect each cathode in common. As a result, each diode can be controlled separately in order to emit a different color light. The lamp, thus, works as a multi-color light emitting device.

In the multi-color LED lamp shown in FIG. 5a, each anode of light emitting diodes 1a, 1b, and 1c should be controlled separately. To this end, the same number of bonding wires as that of diodes placed on lead 2 are required. This fact makes it difficult to reduce the number of parts which compose of the lamp, thus causing a large problem to miniaturize the whole structure of the lamp.

Further, the top surfaces of three bonding leads 4a, 4b, and 4c and the top surface of lead 2 are arranged on a straight line. As a result, the distance between light emitting diode 1b and the corresponding bonding lead 4b in the most outside diameter becomes large, thus making bonding wire 3b longer. This fact also makes bonding works difficult.

In order to solve the above mentioned problem, a structure, in which the anode sides of two light emitting diodes are connected with one bonding lead, can be invented to reduce one bonding lead.

In this structure, however, two light emitting diodes connected with one bonding lead are parallel-connected in the forward direction between lead 2 and the bonding lead. Accordingly, these two diodes cannot be driven separately by external means in order to control their emission independently. Monochromic emission cannot, therefore, be obtained from these two diodes, thus causing restriction on the color tone of the whole LED lamp.

As explained above, in the prior art multi-color LED lamp shown in FIG. 5, it is difficult to obtain a small-sized LED lamp, because each light emitting diode should be driven independently. This fact also deteriorates the efficiency of the assembly works of LED lamps.

SUMMARY OF THE INVENTION

This invention has been made to overcome the above mentioned problems of the prior art LED lamp.

Therefore, the main objective of the present invention is to provide a semiconductor light emitting device having a plurality of light emitting diodes, the device which can be formed smaller without loosing the independent control of individual diodes.

Another objective of the present invention is to provide a circuit device for controlling a semiconductor light emitting device having a plurality of light emitting diodes so as to drive individual diodes separately.

Therefore, the first feature of the present invention is to provide a semiconductor light emitting device having a plurality of light emitting diodes, the device which is comprised of the following: at least three light emitting diodes in which at least one pair of light emitting diodes connected parallel in the reverse direction is included; a common terminal in which each one of the electrodes of all the said light emitting diodes is commonly connected with; at least one first terminal in which the other electrodes of said diode pair are commonly connected with; and at least one second terminal which is connected with the rest electrode of said light emitting diode, which is not included in said diode pair.

The second feature of the present invention is to provide a semiconductor light emitting device having a plurality of light emitting diodes, each of which is driven separately, the device is comprised of the following: at least three light emitting diodes in which at least one pair of light emitting diodes connected parallel in the reverse direction is included; a common terminal in which each one of the electrodes of all the said light emitting diodes is commonly connected with; at least one first terminal in which the other electrodes of said diode pair are commonly connected with; at least one second terminal which is connected with the rest electrode of said light emitting diode, which is not included in said diode pair; a power source whose voltage is enough for driving said light emitting diodes; a low electric power source; at least three switching means, each of which is connected to one of said first, second, or common terminal so as to connect either one of said two power sources with said diodes; and means for controlling said switching means such that the power sources connected with said first terminal and said common terminal are different for each other and the power sources connected with said second terminal and said common terminal are different for each other.

Among said three light emitting diodes, two of them, which are connected parallel in the reverse direction, can be driven by time sharing current so as to cause alternate pulse emission.

According to said first and second features of the present invention, said three light emitting diodes can be controlled separately to emit light using only three terminals. So, the space of the fourth terminal, which has been required in the prior art device, can be saved to reduce the whole size of the device of this invention.

These and other objectives, features, and advantages of the present invention will be more apparent from the following detailed description of preferred embodiments in conjunction with the accompanying drawings.

BRIEF DESCRIPTION OF THE DRAWINGS

FIG. 1a is a view showing the structure of a semiconductor light emitting device according to one embodiment of the present invention;

FIG. 1b shows the equivalent circuit of the device shown in FIG. 1a;

FIG. 2a is a schematic diagram of the circuit to drive the device shown in FIGS. 1a and 1b;

FIG. 2b is a schematic diagram of the circuit to generate control signals for the driving circuit shown in FIG. 2a;

FIG. 4a is a view showing the structure of a semiconductor light emitting device according to another embodiment of the present invention;

FIG. 4b shows the equivalent circuit of the device shown in FIG. 4a;

FIG. 5a is a view showing the structure of a prior art semiconductor light emitting device having a plurality of light emitting diodes; and FIG. 5b shows the equivalent circuit of the device shown in FIG. 5a.

DETAILED DESCRIPTION OF PREFERRED EMBODIMENTS

Preferred embodiments of the present invention will be explained below with reference to figures.

Figure 1:
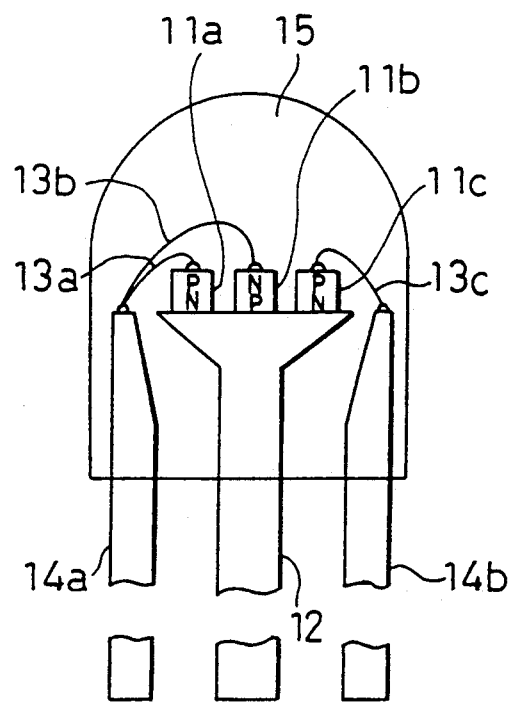
Figure 1:
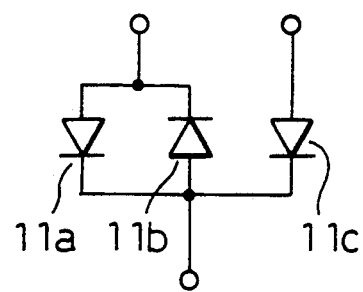

FIG. 1a shows the structure of a semiconductor light emitting device according to one embodiment of the present invention, and FIG. 1b shows the equivalent circuit of the device shown in FIG. 1a.

As shown in FIG. 1a, the device of this embodiment is characterized by the fact that it has only two bonding leads 14a and 14b, in spite of having three light emitting diodes 11a, 11b, and 11c in the same manner as the prior art device. Of course, the wave lengths of emission in these light emitting diodes are different for each other.

For example, GaP light emitting diode 11a, which emits a green light, and SiC light emitting diode 11c, which emits a blue light, are placed on the top surface of lead 12. In this case, the cathode sides (N sides) of these diodes are placed to face the top surface of lead 12 to have electric connection with lead 12. On the other hand, for example, a GaAlAs light emitting diode 11b, which emits a red light, is placed on the top surface of lead 12 by facing its anode side (P side) to said surface, and so, electrically connected with the lead 12. Both of diodes 11a and 11b are connected with one bonding lead 14a through gold wires 13a and 13b respectively. Light emitting diode 11c is connected with bonding lead 14b through gold wire 13c. These diodes, bonding wires, and parts of leads 12a, 14a, and 14b are, then, molded by plastics 15, thus providing a multi-color LED lamp which emit red (R), green (G), and blue (B) lights.

Among three light emitting diodes 11a, 11b, and 11c, as shown in FIG. 1b, diodes 11a and 11b are parallel-connected in the reverse direction for each other between leads 12 and 14a.

The driving procedure of the above mentioned multi-color LED lamp, which includes a pair of light emitting diodes parallel-connected in the reverse direction, will be explained next.

Figure 2:
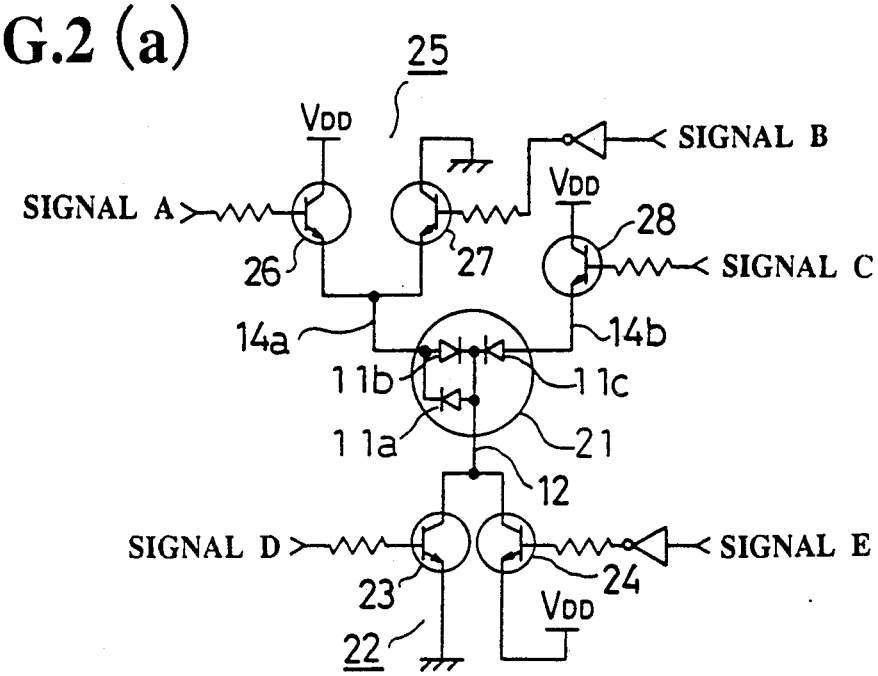
Figure 2:
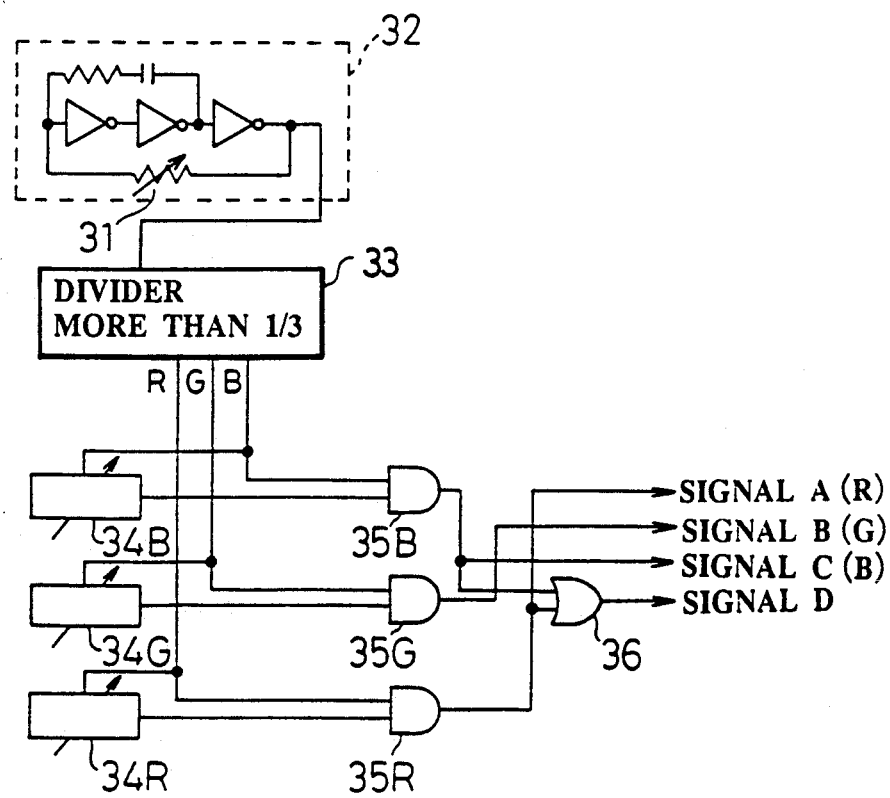

FIGS. 2a and 2b show the structure of a circuit to drive the multi-color LED lamp shown in FIGS. 1a and 1b. Especially, FIG. 2a shows the structure of a driving part in said driving circuit, and FIG. 2b shows the structure of a control signal generation part to supply driving signals into said driving part.

As shown in FIG. 2a, common lead 12 for light emitting diodes 11a, 11b, and 11c in multi-color LED lamp 21 is connected with first switching means 22. This means 22 is comprised of an NPN transistor 23, in which the emitter is grounded, and a PNP transistor 24, in which the emitter is connected to a power source ($V_{DD}$). These transistors 23 and 24 are made to be a conductive state alternately, in order to connect lead 12 with either one of said sources, that is, the power source $V_{DD}$ or the ground.

On the other hand, lead 14a, through which light emitting diodes 11a and 11b are parallel-connected with each other, is connected with a second switching means 25. This means 25 is comprised of transistors 26 and 27, and performs the switching of power supply, in the same manner as that of the first switching means 22. These first and second switching means 22 and 25 are controlled to select different power supplies ($V_{DD}$ or the ground) for each other alternately.

Lead 14b, in which the P side of light emitting diode 11c is connected with, is connected to power source $V_{DD}$ through an NPN transistor 28.

The conduction of transistors 23, 24, 26, 27, and 28 in said driving circuit are controlled according to signals A-D, which are generated in the control signal generation part shown in FIG. 2b.

As shown in FIG. 2b, the control signal generation part is comprised of the following: a pulse generator 32 for producing pulse signals whose pulse width can be changed by a variable resistor 31; a divider 33 for producing three kind of pulse signals by dividing a generated pulse from generator 32 into three parts in order to drive said three light emitting diodes 11a, 11b, and 11c respectively; one-shot multivibrators 34B, 34G, and 34R, each of which produces one-shot signals from the corresponding one of said three pulse signals produced in said divider 33; AND gates 35B, 35G, and 35R, each of which performs an AND operation between a pulse signal from divider 33 and an output signal from the corresponding multivibrator; and an OR gate 36 which performs an OR operation between the outputs from said AND gates 35B and 35R.

Figure 3:
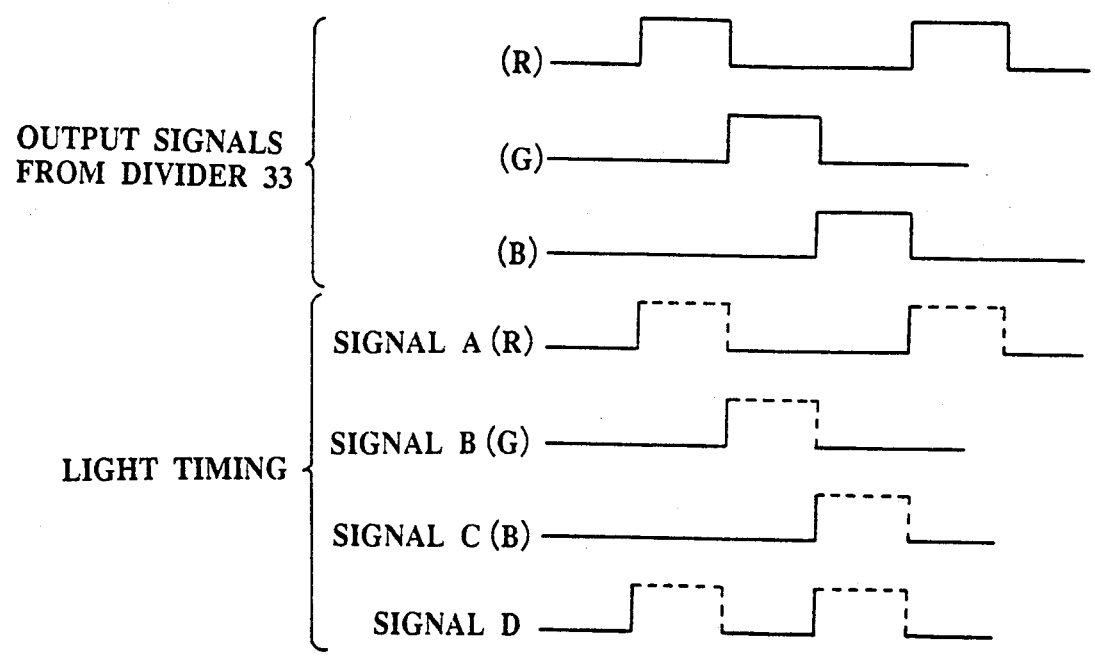
FIG. 3 is a timing chart showing an example of driving timings of the circuit shown in FIGS. 2a and 2b.

In the above mentioned circuit, output signals R, G, and B from divider 33 are obtained by dividing a single pulse generated in pulse generator 32 into three parts, as shown in the timing chart in FIG. 3. These signals are then input to one-shot multivibrators respectively. Signals A, B, and C shown in FIG. 3 are obtained as the result of said AND operations. Also, signal D is obtained as the result of said OR operation. Pulse width of each one-shot pulse signal A, B, or C can be set by arranging the respective one-shot multivibrator 34B, 34G, or 34R.

Among signals A, B, C, and D obtained in said control signal generation part, signal A is then given to transistor 26 in said driving part to be a timing signal for driving red light emitting diode 11b. Signal B is inverted and given to transistors 24 and 27 to be timing signals for driving green light emitting diode 11a. Signal C is given to transistor 28 to be a timing signal for driving blue light emitting diode 11c. And signal D is given to transistor 23 to be a timing signal to light red emitting diode 11b and blue emitting diode 11c.

In the driving system mentioned above, as shown in FIG. 3, signals A and D change their states, first, from a low level to a high level, thus allowing transistors 23 and 26 to conduct. As a result, current is supplied to light emitting diode 11b so as to cause pulse emission.

Next, signal B changes its state from a low level to a high level. In this condition, if signal A and D change their states from the high level to the low level, transistors 24 and 27 become conductive to supply current on light emitting diode 11a. As a result, diode 11a is driven to cause a pulse emission. On the other hand, diode 11b stops lighting.

Still next, signal C and D change their states from a low level to a high level. In this condition, if signal B changes its state from the high level to the low level, transistors 23 and 28 become conductive to supply current on light emitting diode 11c. As a result, diode 11c is driven to cause a pulse emission. On the other hand, diode 11a stops lighting.

As mentioned above, said three light emitting diodes 11a, 11b, and 11c, two of which are parallel connected with each other in the reverse direction, can be driven to emit light one after another by said time sharing driving circuit. The intensity of emission in each light emitting diode 11a, 11b, or 11c can be varied by changing the degree of amplification of the pulse-current-current for diode 11a, 11b, or 11c, or adjusting the pulse width of the one-shot signals which are output from one-shot multi-vibrators.

As a result, in said multi-color LED lamp, it is possible to control from outside separately the values of current, which will be supplied for light emitting diode 11a, 11b, and 11c respectively. Also, the above mentioned LED lamp is very advantageous in that it requires only two bonding leads. So, a small-sized LED lamp can be obtained according to this embodiment. Further, as the result of reducing the number of bonding leads into two, the bonding distance between a light emitting diode and its leads becomes shorter, thus facilitating the bonding and assembly works of the device. It is, thus, possible to mass produce the device more easily.

Figure 4:
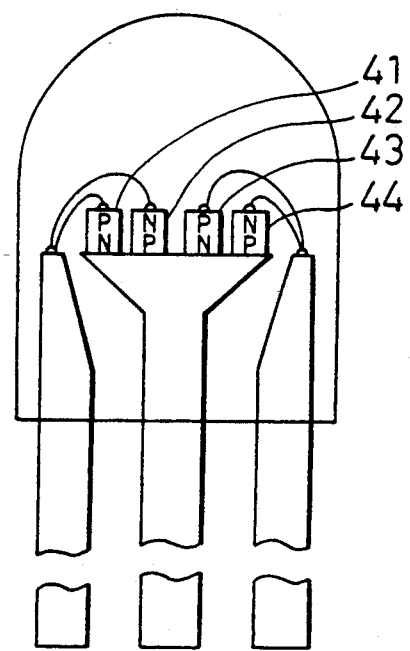
Figure 4:
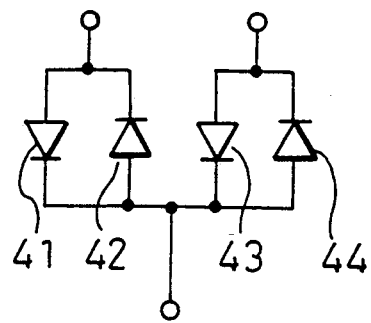
Figure 5:
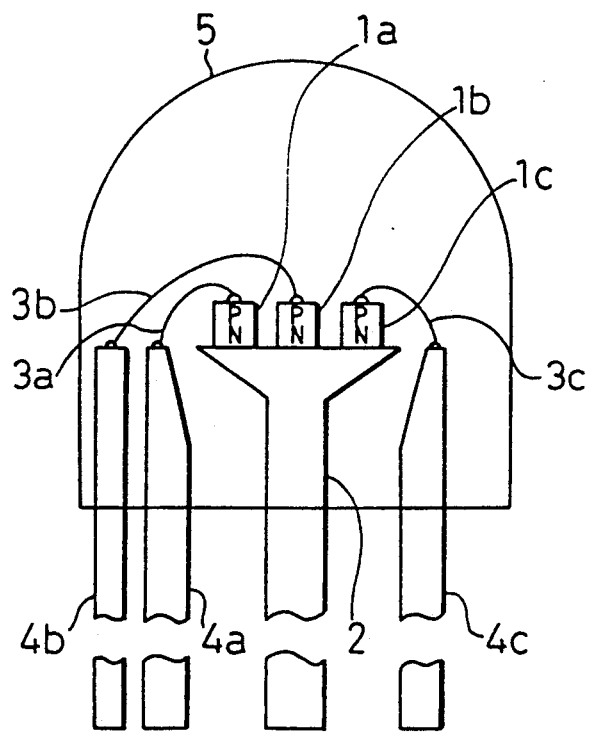
Figure 5:
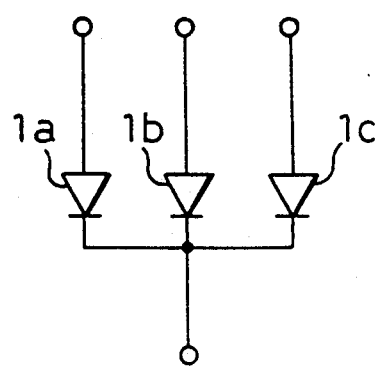

This invention, however, is not limited to the above mentioned embodiments. For example, as shown in FIG. 4a, two pairs of diodes 41, 42 and 43, 44, in which each diode in each pair is connected parallel to the other in the reverse direction, can be placed on a lead to construct a multi-color LED lamp. The connectivity of this lamp is shown in FIG. 4b. The driving circuit shown in FIGS. 2a and 2b can be expanded in order to drive the LED lamp shown in FIGS. 4a and 4b. The same advantages as those obtained from the device shown in FIG. 1 can, of course, be obtained from the device shown in FIGS. 4a and 4b.

The basic idea of this invention can, also, be applied to a device having more than five light emitting diodes so as to construct a multi-color LED lamp having smaller number of leads than the number of diodes. The same advantages as those obtained from the device shown in FIG. 1a can, also, be obtained from this kind of LED lamp.

In summary, two light emitting diodes in the LED lamp of this invention are connected parallel in the reverse direction for each other. One of the common connecting points of these two diodes is still connected with one electrode of the third diode to compose a common terminal. As a result, these three light emitting diodes can be controlled separately to emit light independently with smaller number of terminals than that of the prior art device. It is, thus, possible to miniaturize the whole structure of the LED lamp of this invention as well as to improve the efficiency of its assembly work.

Various modifications will become possible for those skilled in the art after receiving the teachings of the present disclosure without departing from the scope thereof.

What is claimed is:

1. A semiconductor light emitting device having a plurality of light emitting diodes which emit different colored light when an electric current is passed therethrough in a forward direction, comprising:

first, second and third light emitting diodes, each of said first, second and third light emitting diodes having first and second electrodes, said first and second light emitting diodes being connected in parallel in the reverse direction;

a common terminal for providing a common electrical connection to each of said first electrodes of said first, second and third light emitting diodes;

a first terminal for providing a common electrical connection to the second electrodes of said first and second light emitting diodes; and a second terminal for providing electrical connection to the second electrode of said third light emitting diode.

2. The semiconductor light emitting device as claimed in claim 1, wherein a GaP green emitting diode, SiC blue emitting diode, and a GaAlAs red emitting diode are included in said light emitting diodes.

3. The semiconductor light emitting device as claimed in claim 1, wherein said common terminal is comprised of a lead in which all said light emitting diodes are equipped on its top surface.

* * * * *